(12) United States Patent
Dando et al.

(10) Patent No.: US 7,311,947 B2
(45) Date of Patent: Dec. 25, 2007

(54) LASER ASSISTED MATERIAL DEPOSITION

(75) Inventors: Ross S. Dando, Nampa, ID (US); Dan Gealy, Kuna, ID (US); Craig M. Carpenter, Boise, ID (US); Philip H. Campbell, Meridian, ID (US); Allen P. Mardian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 355 days.

(21) Appl. No.: 10/683,806

(22) Filed: Oct. 10, 2003

(65) Prior Publication Data

US 2005/0078462 A1 Apr. 14, 2005

(51) Int. Cl.
*C23C 14/28* (2006.01)
(52) U.S. Cl. .................................... 427/596; 427/96.8
(58) Field of Classification Search ................ 427/596, 427/96.8
See application file for complete search history.

(56) References Cited

U.S. PATENT DOCUMENTS

| | | | | |
|---|---|---|---|---|
| 4,543,486 A | * | 9/1985 | Rose ....................... 250/492.1 |
| 4,579,750 A | * | 4/1986 | Bowen et al. .............. 427/586 |
| 4,655,849 A | | 4/1987 | Schachameyer et al. |
| 4,668,304 A | | 5/1987 | Schachameyer et al. |
| 4,670,063 A | | 6/1987 | Schachameyer et al. |
| 4,670,064 A | | 6/1987 | Schachameyer et al. |
| 4,685,976 A | | 8/1987 | Schachameyer et al. |
| 4,933,206 A | * | 6/1990 | Cox ........................... 427/558 |
| 4,938,996 A | * | 7/1990 | Ziv et al. .................... 427/597 |
| 4,940,505 A | * | 7/1990 | Schachameyer et al. ...... 117/97 |
| 4,980,198 A | * | 12/1990 | Dowben et al. ............. 427/584 |
| 5,102,830 A | | 4/1992 | Sandhu |
| 5,164,222 A | * | 11/1992 | Gottsleben et al. ......... 427/587 |
| 5,387,443 A | * | 2/1995 | Ota et al. ................... 427/586 |
| 5,403,433 A | * | 4/1995 | Morrison et al. ............. 216/60 |
| 5,438,019 A | | 8/1995 | Sandhu |
| 5,472,935 A | * | 12/1995 | Yandrofski et al. ......... 505/210 |
| 5,641,545 A | | 6/1997 | Sandhu |
| 5,648,114 A | * | 7/1997 | Paz De Araujo et al. 427/126.3 |
| 5,682,041 A | * | 10/1997 | Kawakubo et al. ........... 257/38 |
| 5,733,609 A | * | 3/1998 | Wang ......................... 427/561 |
| 5,800,617 A | | 9/1998 | Sandhu |
| 6,051,287 A | | 4/2000 | Marsh |
| 6,064,800 A | | 5/2000 | Gurtej |
| 6,113,751 A | * | 9/2000 | Morgenthaler ......... 204/192.12 |
| 6,143,085 A | | 11/2000 | Marsh |
| 6,187,492 B1 | | 2/2001 | Ri et al. |
| 6,281,072 B1 | | 8/2001 | Li et al. |
| 6,291,341 B1 | | 9/2001 | Sharan et al. |
| 6,499,425 B1 | | 12/2002 | Sandhu et al. |
| 6,573,199 B2 | | 6/2003 | Sandhu et al. |
| 6,613,702 B2 | | 9/2003 | Sandhu et al. |
| 6,683,005 B2 | | 1/2004 | Sandhu et al. |
| 6,720,272 B2 | | 4/2004 | Sandhu et al. |
| 6,730,367 B2 | | 5/2004 | Sandhu et al. |
| 6,764,856 B2 | | 7/2004 | Sandhu et al. |
| 6,793,736 B2 | | 9/2004 | Sandhu et al. |

(Continued)

*Primary Examiner*—Bret Chen
(74) *Attorney, Agent, or Firm*—Schwegman, Lundberg & Woessner, P.A.

(57) ABSTRACT

A method of forming a film on a substrate includes activating a gas precursor to form a material on the substrate by irradiating the gas precursor with electromagnetic energy at a frequency tuned to an absorption frequency of the gas precursor.

13 Claims, 6 Drawing Sheets

U.S. PATENT DOCUMENTS

| | | |
|---|---|---|
| 6,797,337 B2 | 9/2004 | Dando et al. |
| 6,838,114 B2 | 1/2005 | Carpenter et al. |
| 6,838,121 B2 * | 1/2005 | Weimer ...................... 427/250 |
| 6,845,734 B2 | 1/2005 | Carpenter et al. |
| 6,869,479 B2 * | 3/2005 | Shafeev et al. ............... 117/68 |
| 2003/0170389 A1 | 9/2003 | Sandhu |
| 2005/0266168 A1 * | 12/2005 | Poullos ...................... 427/379 |

* cited by examiner

LASER ASSISTED MATERIAL DEPOSITION

FIELD OF THE INVENTION

The present invention relates to electronic device fabrication, in particular, semiconductor device fabrication.

BACKGROUND OF THE INVENTION

Fabrication of electronic devices such as integrated circuits is performed through a series of processes, where each process has its own thermal characteristics. Some processes require high temperatures, while others not requiring high temperatures are performed at temperatures elevated over ambient. The elevated temperatures, whether small or large, provide an energic environment in which reactants, or precursors, interact chemically to form a desired material composition. This material composition may be an intermediate composition or the final composition forming an integral portion of the electronic device or system being constructed.

A chemical reaction to form a desired material composition is conducted by providing energy to reactant gases. This energy is typically provided by heating the reactant gases, the reaction environment, and/or a substrate on which the resultant composition of the chemical reaction is to be formed. These heating processes may place limitations on the fabrication process. For instance, reactant gases that can provide the desired resultant composition upon chemical reaction may be eliminated from being used because the chemistries of these gases may be sensitive to heating, making thermal control difficult. In other instances, conventional heating methods may be inefficient for a wide variety of gases. As these gases are heated, a significant percentage by mass volume may decompose into unwanted gas compositions prior to undergoing the intended chemical reaction with other materials or gases. Then, only the non-decomposed portion of the volume of reactant gas contributes to the fabrication process, limiting the reaction efficiency. Thus, control of the thermal characteristics for forming various materials to be used in electronic devices and systems provides a significant challenge for fabrication processes.

DETAILED DESCRIPTION OF THE INVENTION

Figure 1:
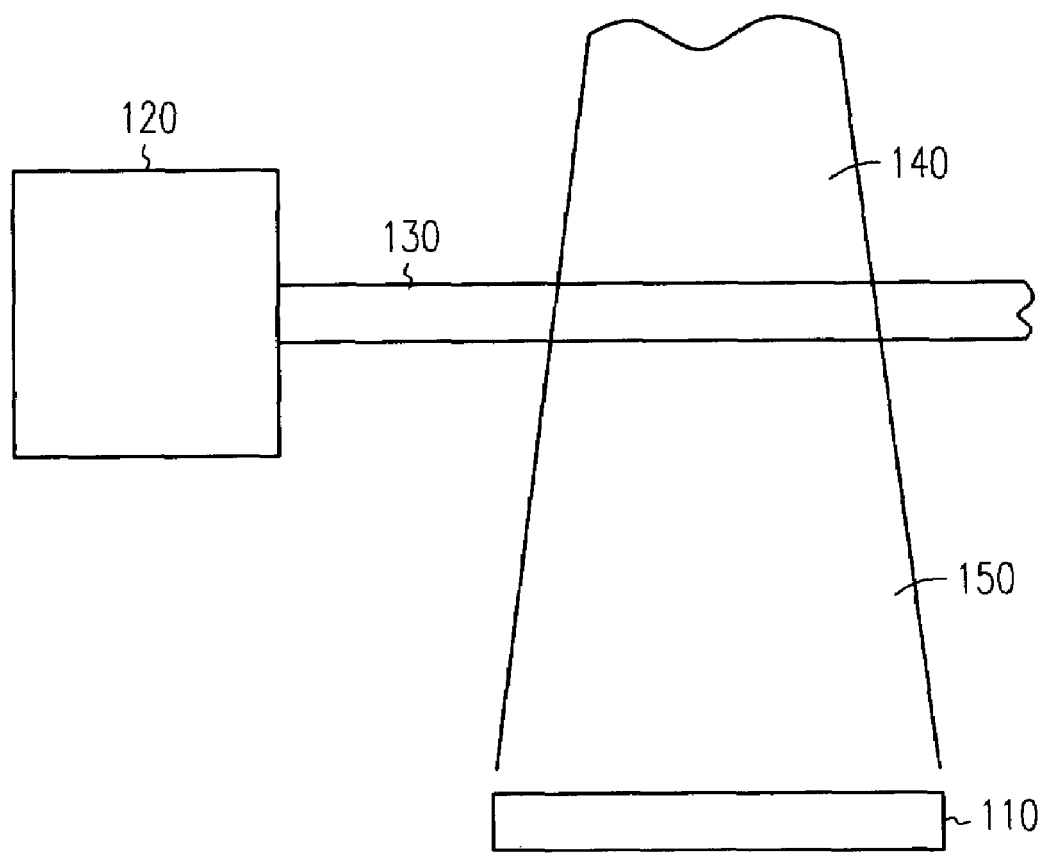
FIG. 1 illustrates an embodiment of a process for point of use activation in laser assisted deposition of a material onto a substrate, according to the teachings of the present invention.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form a material composition for an integrated circuit (IC) and other electronic devices and systems. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

In an embodiment, material is formed on a substrate by a deposition process in which the energy of activation is controlled. This embodiment includes activating a gas precursor by irradiating the gas precursor with electromagnetic energy at a frequency tuned to an absorption frequency of the gas precursor. The electromagnetic energy may be from a source whose electromagnetic output can be selectively filtered and attenuated to provide electromagnetic energy at a select frequency. The select frequency of the electromagnetic energy provided is the center frequency, or peak frequency, of the electromagnetic energy. The electromagnetic energy has energy components within a linewidth, or spectral bandwidth, about the center frequency. In embodiments, the linewidth about the center frequency is narrow providing electromagnetic energy tuned to a frequency which can be targeted for specific use. By controlling the frequency, or frequencies, of the electromagnetic energy, the amount of energy applied to the gas precursor can be regulated such that the gas precursor does not decompose prior to undergoing the desired reaction for forming the material on the substrate. Use of energy that can be tuned to specific amounts correlated to specific absorption frequencies of a gas precursor allows gas precursors with delicate chemistries to be efficiently used in a variety of deposition processes.

In an embodiment, to provide control of the energy of activation of a gas precursor, a laser source is provided to generate electromagnetic energy having a frequency tuned to the desired absorption frequency of the gas precursor. The laser source provides packets of energy specifically tuned to a target bond energy. Upon irradiation by the tuned electromagnetic energy, specific bonds of a precursor are destabilization leading to a chemical reaction with other precursors introduced into a reaction chamber or with the surface of the substrate on which material is being deposited. Providing control of the energy of activation can be considered as providing point of use activation. In the various embodiments, point of use activation provides heating essentially at localized levels without the general heating of the gas precursor and other gases, including carrier gases, in a gas flow.

Activating a substance includes providing energy to that substance to attain a necessary level of energy for the occurrence of a chemical reaction. Supplying the energy can be realized by heating or irradiating the substance with electromagnetic radiation. The supplied energy is absorbed by the substance with the excitation of the molecules within the substance to a higher energy state relative to the state of the molecule at ambient conditions without the external energy stimulus. An excited or activated molecule may have electrons that have moved into higher energy states breaking bonds existing before the activation energy is supplied.

In an embodiment, point of use activation in laser assisted deposition, i.e., laser assisted deposition in which the energy of activation is controlled, provides an opportunity to supply a specific amount of energy at a specific frequency to a sensitive chemical at a predetermined level of activation for a desired use. The predetermined level can be regulated by controlling the intensity of the output light from one or more lasers. By controlling the level of activation of the given chemical, deterioration of the chemical before it provides a desired reaction for a process can be prevented. Additionally, various embodiments for point of use activation in laser assisted deposition allow use of short time duration specie chemicals in a deposition process.

In an embodiment, activation energy is supplied by a laser beam at specific amounts to attain a desired activation state. In an embodiment, the desired activation state is one in which specific bonds are broken to prepare for a predetermined chemical reaction leading to the deposition of a material onto a substance. This deposition process may include illuminating a gas precursor in a gas flow where the chemical reaction occurs downstream from the illumination location. Alternately, this deposition process may include illuminating a gas precursor at the surface of a substrate with the chemical reaction occurring at this surface. In another embodiment, the desired activation state is one in which specific bonds are broken to provide for the decomposition of one or more gases into one or more gas reactants to provide the chemical reaction for depositing material on a substrate. This decomposition can occur upstream from a substrate or at the substrate surface.

An embodiment includes apparatus for a method of forming a film on a substrate that includes activating a gas precursor to deposit a material on the substrate by irradiating the gas precursor with electromagnetic energy at a frequency tuned to an absorption frequency of the gas precursor. The electromagnetic energy can be provided by an array of lasers. The frequency of the laser beam is selected by switching from one laser in the array to another laser in the array. The laser array may include laser diodes, one or more tunable lasers, solid state lasers, or gas lasers. The frequency of the electromagnetic energy is selected to impart specific amounts of energy to a gas precursor at a specific frequency to activate the gas precursor.

FIG. 1 illustrates an embodiment of a process for point of use activation in laser assisted deposition of a material onto a substrate 110. Substrate 110 may include, but is not limited to, substrate materials such as silicon, silicon-on insulator (SOI), silicon-on sapphire (SOS), silica, ceramic, alumina, metals, organic materials, silicon-germanium, germanium, or gallium arsenide. A laser source 120 provides a laser beam 130 that illuminates a gas flow 140 to provide an activated gas flow 150 having one or more activated gas precursors. The process includes adjusting the laser beam to a select frequency correlated to a specific absorption frequency of the gas precursor.

In an embodiment, laser beam 130 is adjusted to a select frequency by switching laser beam 130 from an output of one laser in a laser array to an output of another laser in the laser array of source 120. Laser source 120 may include an array of diode lasers. In an embodiment, the laser source 120 includes one or more tunable lasers. In an embodiment, laser source 120 provides laser beam 130 with a predetermined number of frequencies in order to activate specific gases in gas flow 140, or to stimulate a number of absorption frequencies for a given gas precursor in gas flow 140.

The location at which laser beam 130 interacts with one or more gas precursors in gas flow 140 is controlled so that the activated gas precursors are within a predetermined distance from substrate 110. The distance from the region in which gas flow 140 is illuminated with laser beam 130 can be measured in terms of the mean free path of an activated molecule defining a gas precursor, where the mean free path of a molecule is the average distance traveled by the molecule between collisions of the molecule with other molecules. The illumination location relative to substrate 110 in terms of a number of mean free paths can be controlled by regulating environmental parameters, such as pressure. In an embodiment, a location, at which the laser beam illuminates gas flow 140 to activate one or more precursors, occurs at a distance from the substrate that is within a mean free path of an activated gas precursor. In an embodiment, a location, at which the laser beam illuminates gas flow 140 to activate one or more precursors, occurs at a distance from the substrate that is within ten mean free paths of an activated gas precursor. In an embodiment, a location, at which the laser beam illuminates gas flow 140, is within about two or three centimeters of the substrate surface. The control of the relative illumination location can be realized with laser source 130 fixed in a horizontal positive relative to gas flow 140 with the substrate vertically adjusted. Alternately, the control can be realized with laser source 130 rastered, or scanned, across the surface of substrate 110.

In embodiment, activating a gas precursor includes breaking specific bonds in a gas precursor. This activation places the gas precursor in an excited state for chemically reacting with specific reactants in gas flow or which specific compositions present at or on the surface of substrate 110. Using laser beam 130 to activate a gas precursor in gas flow 140 allows for precision in controlling the activation process that is not as efficiently regulated by conventional heating methods. In an embodiment, a laser is used to provide point of use activation in an atomic layer deposition (ALD) process.

ALD, also known as atomic layer epitaxy (ALE), was developed in the early 1970's as a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. Between the pulses, the reaction chamber is purged with a gas, which in many cases is an inert gas, and/or evacuated.

In a chemisorption-saturated ALD (CS-ALD) process, during the first pulsing phase, reaction with the substrate occurs with the precursor saturatively chemisorbed at the substrate surface. The chemisorption process can be assisted using an embodiment for point of use activation. Subsequent pulsing with a purging gas removes precursor excess from the reaction chamber.

The second pulsing phase introduces another precursor on the substrate where the growth reaction of the desired layer takes place. Embodiments for point of use activation can provide a controlled temperature increase for the growth reaction in both the second precursor and the chemisorbed species. Subsequent to the layer growth reaction, reaction by-products and precursor excess are purged from the reaction chamber. With favourable precursor chemistry where the precursors adsorb and react with each other on the substrate aggressively, one ALD cycle may be performed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Thus, ALD provides for controlling layer thickness in a straightforward manner by controlling the number of growth cycles.

The precursors used in an ALD process may be gaseous, liquid or solid. However, liquid or solid precursors must be volatile. The vapor pressure must be high enough for effective mass transportation. Also, solid and some liquid precursors need to be heated inside the reaction chamber and introduced through heated tubes to the substrates. The necessary vapor pressure must be reached at a temperature below the substrate temperature to avoid the condensation of the precursors on the substrate. Due to the self-limiting growth mechanisms of ALD, relatively low vapor pressure solid precursors may be used though evaporation rates may somewhat vary during the process because of changes in their surface area.

There are several other characteristics for precursors used in ALD. The precursors must be thermally stable at the substrate temperature because their decomposition would destroy the surface control and accordingly the advantages of the ALD method that relies on the reaction of the precursor at the substrate surface. The control of the surface reaction is enhanced in various embodiments by providing reaction energy by laser assisted point of activation processes.

The precursors have to chemisorb on or react with the surface, though the interaction between the precursor and the surface as well as the mechanism for the adsorption is different for different precursors. The molecules at the substrate surface must react aggressively with the second precursor to form the desired solid layer. Additionally, precursors should not react with the layer to cause etching, and precursors should not dissolve in the layer. In an embodiment, a laser beam rastered across the substrate surface provides the energy for activation for the molecules to react aggressively at the surface. Using highly reactive precursors in ALD contrasts with the selection of precursors for conventional CVD.

The by-products in the reaction must be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The precursor reaction at the substrate is typically followed by an inert gas pulse to remove excess precursor and by-products from the reaction chamber prior to pulsing the next precursor of the fabrication sequence. Point of use activation can be applied to enhance and control the surface reaction and can be terminated while by-products are removed using the inert gas pulse.

By RS-ALD, layers can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

The characteristics of RS-ALD include continuity at an interface, conformality over a substrate, use of low temperature and mildly oxidizing processes, freedom from first wafer effects and chamber dependence, growth thickness dependent solely on the number of cycles performed, and ability to engineer multilayer laminate layers with resolution of one to two monolayers. RS-ALD allows for deposition control on the order on monolayers and the ability to deposit monolayers of amorphous layers.

In embodiment, activating a gas precursor includes breaking specific bonds to decompose one or more gases into two or more chemical vapors that act as gas reactants in a chemical reaction leading to the deposition of material on substrate 110. Using laser beam 130 to decompose gases in gas flow 140 allows conveniently obtained complex molecules to be used to provide the gas reactants for a deposition process. Illuminating the complex molecule with the laser beam at specific frequencies may allow for regulating the decomposition of the complex molecule into one or more desired molecules in a manner that provides more control and efficiency than other decomposition processes. In an embodiment, a laser is used to provide point of use activation in a chemical vapor deposition process.

In a CVD process using laser assisted point of use activation, the activation energy for the vapor species used in a desired deposition process is specifically supplied and regulated by controlling a laser beam. The chemical reaction in the CVD process may occur in gas flow 140 upstream from substrate 110, or near the surface of substrate 110, or on the surface of substrate 110. The gases selected for gas flow 140 are chosen such that by-products of a chemical reaction using the laser activated gases of gas flow 150, other than the material being formed on substrate 110, do not interact to deposit on substrate. Point of use activation using source 120 allows for maintaining the deposition environment and substrate 110 at temperatures lower than needed for deposition of unwanted by-products.

Figure 2:
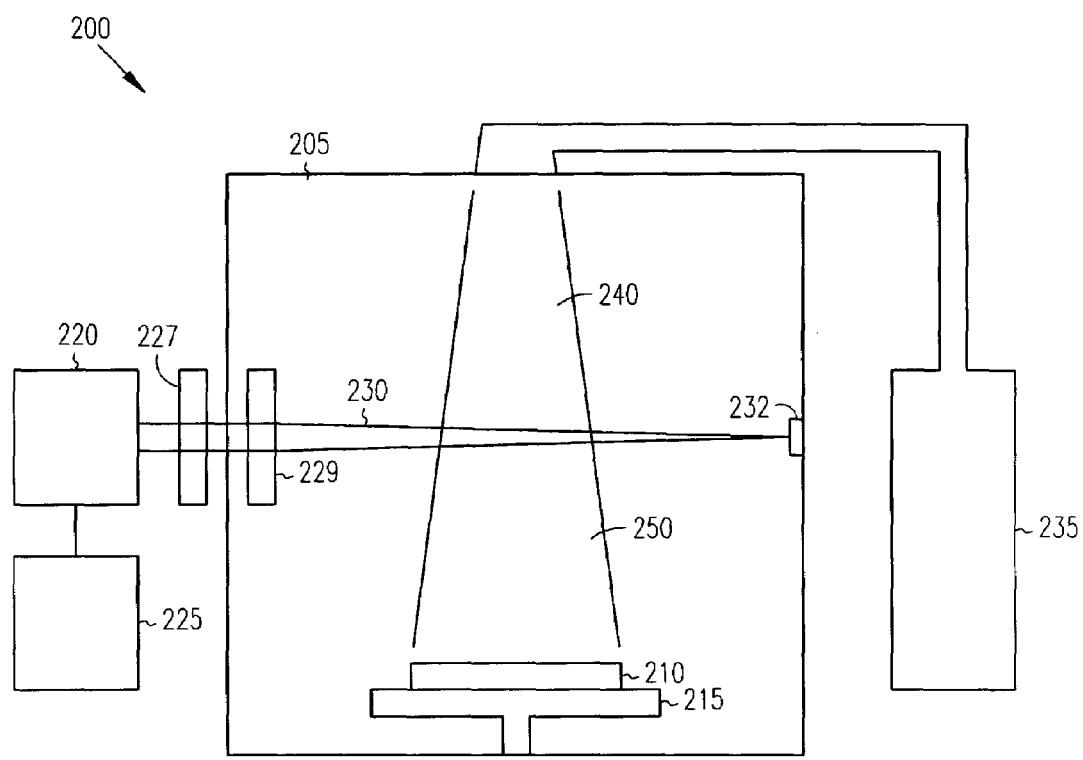
FIG. 2 depicts an embodiment of a deposition system including a laser source, according to the teachings of the present invention.

FIG. 2 depicts an embodiment of a deposition system 200 including a laser source 220. Deposition system 200 includes, in addition to laser source 220, a reaction chamber 205, a substrate holder 215 on which a substrate 220 can be mounted, a gas source 235 which provides a gas to reaction chamber 205, and laser control circuitry 225. Laser control circuitry 225 controls laser 220 to provide a laser beam 230 to illuminate gas flow 240 to provide an activated gas flow 250 having one or more activated gas reactants.

Control for locating laser beam 230 relative to gas flow 240 can be provided by control optics. External control optics 227 are provided for an embodiment that places laser source 220 outside reaction chamber 205. Internal control optics 229 is provided for an embodiment that places control of laser beam 230 inside reaction chamber 205. External control optics 227 and internal control optics 229 provide one or more functions, including but not limited to, steering laser beam 230 and focusing or expanding laser beam 230. Laser beam can be steered to raster across the surface of substrate 210. In an embodiment, laser source 220 is mounted in reaction chamber 205 with laser control circuitry mounted external to reaction chamber 205. Alternately, laser control circuitry 225 can also be mounted in reaction chamber 205. In an embodiment, laser source 220 can be positioned in reaction chamber 205 along the portion of reaction chamber 205 where a gas enters reaction chamber 205 from gas source 235.

Control optics 227 and 229 may also include optical filters and attenuators. The spectral width of a laser beam about its laser frequency may include frequencies correlated to absorption frequencies for gases in gas flow 240 other than the desired gas precursor, or precursors, or frequencies correlated to an absorption frequency of the gas precursors at which stimulation is unwanted. Optical filters and optical attenuators can be used to eliminate or significantly reduce stimulation of unwanted energy absorption at frequencies different from the targeted frequencies.

Additionally, laser beam 230 can be constrained to interact with gas flow 240 in a single pass without reflected light interacting with gas flow 240 or activated gas flow 250 by steering or directing laser beam 230 from its input through gas flow 240 to a laser target 232. Laser target 232 is adapted to retain the light incident upon it from laser beam 230 without significant reflection. The light irradiating target 332 may be absorbed or directed out of reaction chamber 205. In another embodiment, laser target 232 includes optics to manage the redirection of incident light back to gas flow 240 or activated gas flow 250 at specific locations which can be regulated by controlling the optics and circuitry of laser target 232.

In an embodiment, laser control circuitry 225 is configured to select a frequency for laser beam 230 by switching an output of one laser in a laser array of source 220 to an output of another laser in the laser array of source 220. Laser source 220 may include an array of diode lasers. Alternately, laser source 220 includes one or more tunable lasers. In an embodiment, laser source 220 provides laser beam 230 with a predetermined number of frequencies in order to activate a number of gas precursors in gas flow 240 or to activate a specific gas precursor at a number of absorption frequencies of the gas precursor.

Figure 3:
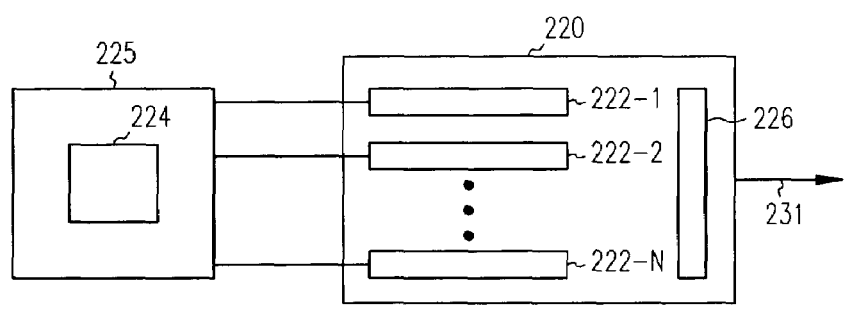
FIG. 3 depicts an embodiment of a laser source that can be used with various deposition systems to provide a process for point of use activation in laser assisted deposition of a material onto a substrate, according to the teachings of the present invention.

FIG. 3 depicts an embodiment of laser source 220 of FIG. 2 that can be used with various deposition systems to provide a process for point of use activation in laser assisted deposition of a material onto a substrate. In an embodiment, laser source 220 includes an array of lasers having individual lasers 222-1-222-N. In an embodiment, each laser 222-1-222-N has an output laser frequency different than the other lasers 222-1-222-N. In an embodiment, each laser 222-1-222-N is a diode laser. Alternately, laser source 220 may include one or more tunable lasers. In various embodiments, lasers 222-1-222-N include other solid state lasers or gas lasers. The laser array, lasers 222-1-222-N, are located directly on a reaction chamber, in a delivery line for gases, or in a small reservoir directly connected to a reaction chamber and positioned in a precursor gas flow stream.

Laser source 220 having an array of lasers allows for activating molecules at various frequencies specifically tuned to an absorption frequency of the molecule. The output from laser source 220 may be, but is not limited to, visible, infrared, or ultraviolet radiation. Laser control circuitry 225 regulates the intensity of the output of each laser 222-1-222-N, which controls the amount of energy in the laser output at its given frequency. Laser control circuitry 225 includes switching circuitry 224 to regulate an output 231 of laser source 220. Switching circuitry 224 regulates which lasers of the 222-1-222-N lasers are on and which are off. On demand, switching circuitry 224 can switch one or more lasers on while switching the remaining lasers off, from control signals provided from or to laser control circuitry 225. With the output of two or more lasers 222-1-222-N provided in output 231 of laser source 220, energy can be supplied to a gas flow at two or more specific energies tuned to desired absorption frequencies within the gas flow. The output of lasers may be steered from laser source 220 using optics control 226 to provide output 231 of laser source 220. When laser source 220 is used in a system such as deposition system 200 of FIG. 2, output 231 becomes laser beam 230.

In an embodiment, laser source 220 is detachable from a reactor chamber. For each deposition process involving a different set of gas precursors to deposit different materials onto a substrate at different stages of processing or in fabricating different systems or devices, a different laser source 220 can be mounted to or within the reaction chamber. The array of lasers of the newly mounted laser source 220 is selected to have laser frequencies correlated to the absorption frequencies of the new set of gas precursors.

The elements depicted in FIGS. 2 and 3 are those elements necessary for discussion of embodiments of the present invention such that those skilled in the art may practice various embodiments of the present invention without undue experimentation. Additional gas sources and environmental controls can be used in a deposition system in conjunction with the elements of FIGS. 2 and 3. Such a deposition system can be used in different deposition processes using various embodiments for laser assisted point of use activation as discussed herein. An exemplary embodiment for a deposition system having a laser source and control circuitry is an atomic layer deposition system as depicted in FIG. 4.

Figure 4:
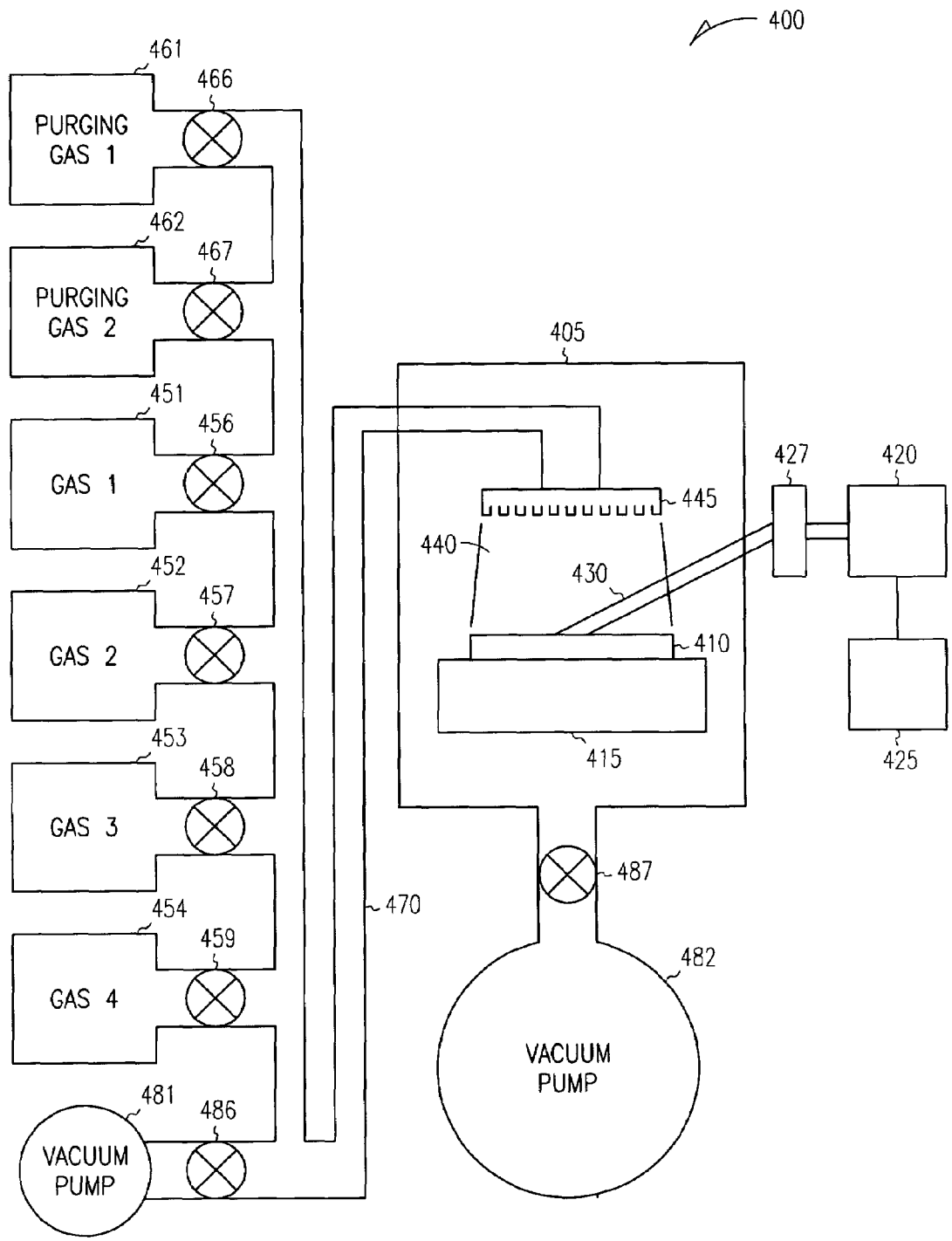
FIG. 4 depicts an embodiment of a deposition system using a laser source that can be applied to atomic layer deposition, according to the teachings of the present invention.

In FIG. 4, a substrate 410 is located inside a reaction chamber 405 of ALD system 400 including a laser source 420 and laser control circuitry 425. ALD system may include optional control optics 427 that may be located interior or exterior to reaction chamber 405. Laser source 420 may be located directly on a reaction chamber, in a delivery line for gases, or in a small reservoir directly connected to a reaction chamber and positioned in a precursor gas flow stream. Also located within reaction chamber 420 is a substrate holder 415, which can be configured with a temperature control to regulate the substrate temperature. A gas-distribution fixture 445 introduces precursor gases to the substrate 410. Each precursor gas originates from individual gas sources 451-454 whose flow is controlled by mass-flow controllers 456-459, respectively. Each gas source, 451-454, provides a precursor gas either by storing the precursor as a gas or by providing a location and apparatus for evaporating a solid or liquid material to form the selected precursor gas. Furthermore, additional gas sources may be included, one for each precursor employed.

Also included in ALD system 400 are purging gas sources 461, 462, each of which is coupled to mass-flow controllers 466, 467, respectively. Furthermore, additional purging gas sources may be constructed in ALD system 400, one purging gas source for each precursor gas. For a process that uses the same purging gas for multiple precursor gases less purging gas sources are used in ALD system 400.

Gas sources 451-454 and purging gas sources 461-462 are coupled by their associated mass-flow controllers to a common gas line or conduit 470, which is coupled to the gas-distribution fixture 445 inside reaction chamber 420. Gas conduit 470 is also coupled to vacuum pump, or exhaust pump, 281 by mass-flow controller 486 to remove excess precursor gases, purging gases, and by-product gases at the end of a purging sequence from gas conduit 270.

Vacuum pump, or exhaust pump, 482 is coupled by mass-flow controller 487 to remove excess precursor gases, purging gases, and by-product gases at the end of a purging sequence from reaction chamber 420. Vacuum pumps 481, 482 may also be used in regulating the pressure in reaction chamber 405. For convenience, control displays, mounting apparatus, temperature sensing devices, substrate maneuvering apparatus, and necessary electrical connections as are known to those skilled in the art are not shown in FIG. 4.

Gas-distribution fixture 445 provides a gas flow 440 that is illuminated by a laser beam 430. Laser beam 430 may be rastered across the surface of substrate 410 to provide specifically tuned energy to gas flow 440 at or on the substrate surface. Alternately, laser beam can provided substantially perpendicular to the gas flow or at a selected angle with respect to gas flow 440. Laser source may be mounted in reaction chamber 405. In an embodiment, laser source 420 is mounted in reaction chamber such that laser beam 430 is provided in line with gas flow 440.

Various embodiments of a laser source 420 and laser control circuitry 424 can be realized using embodiments as described with respect to FIG. 3. In an embodiment, laser source 420 includes an array of lasers having individual lasers, where the output frequency for each laser is different than the other lasers in the array. In an embodiment, each laser of laser source 420 is a diode laser. Alternately, laser source 420 may include one or more tunable lasers. In various embodiments, laser source 420 may include other solid state lasers or gas lasers.

Laser source 420 having an array of lasers allows for activating molecules at various frequencies specifically tuned to an absorption frequency of a specifically selected molecule. Laser control circuitry 425 regulates the intensity of the output of each laser, which controls the amount of energy in the laser output at its given frequency. Laser control circuitry 425 includes switching circuitry to regulate the output of laser source 420. The switching circuitry of laser control circuitry 425 regulates which lasers of the laser array are on and which are off. On demand, the switching circuitry of laser control circuitry 425 can switch one or more lasers on while switching the remaining lasers off, from control signals provided from or to laser control circuitry 425. With the output of two or more lasers provided in the output of laser source 420, energy can be supplied to a gas flow at two or more specific energies tuned to desired absorption frequencies within the gas flow. In an embodiment, the frequencies to switch the laser beam can be tuned includes at least one identified absorption frequency for each of the gas precursors used in the ALD formation of a material on a substrate. Since the purging gases are selected for their non-reactive natural, laser source 420 is not required to have an output frequency associated with the purging gases, though it may, and can be placed in an off state during the gas purging sequences of the ALD process.

Control optics 427 may also include optical filters and attenuators. The spectral width of a laser beam 430 about its laser frequency may include frequencies correlated to absorption frequencies for gases in gas flow 440 other than the desired gas precursor, or precursors, or frequencies correlated to an absorption frequency of the gas precursors at which stimulation is unwanted. Optical filters and optical attenuators can be used to eliminate or significantly reduce stimulation of unwanted energy absorption at frequencies different from the targeted frequencies.

Those of ordinary skill in the art of semiconductor fabrication understand the use, construction and fundamental operation of reaction chambers for deposition of material layers. Embodiments of the present invention may be practiced on a variety of such reaction chambers without undue experimentation. Furthermore, one of ordinary skill in the art will comprehend the necessary detection, measurement, and control techniques in the art of semiconductor fabrication upon reading and studying this disclosure.

The elements of ALD system 400 of FIG. 4 and deposition system 200 of FIG. 2 may be controlled by a computer. To focus on the use of laser assisted point of activation processes and apparatus in ALD system 400 and deposition system 200 in the various embodiments of the present invention, the computer is not shown. Those skilled in the art can appreciate that the individual elements such as pressure control, temperature control, and gas flow within these deposition systems may be under computer control for management and regulation. Determination of the environmental conditions, precursors used, purging gases employed, and pulse periods for the precursors and purging gases may be made without undue experimentation.

In an embodiment, a computerized method and the computer-executable instructions for a method for laser assisted point of use activation in the formation of materials on a substrate includes controlling an environment of a reaction chamber, a laser source, providing gas precursors, pulsing gas precursors, and pulsing of purging gases, one for each precursor gas and pulsing each purging gas after pulsing the associated precursor gas. The computer-executable instructions may be provided in any computer-readable medium. Such computer-readable medium may include, but is not limited to, floppy disks, diskettes, hard disks, CD-ROMS, flash ROMS, nonvolatile ROM, and RAM.

Figure 5:
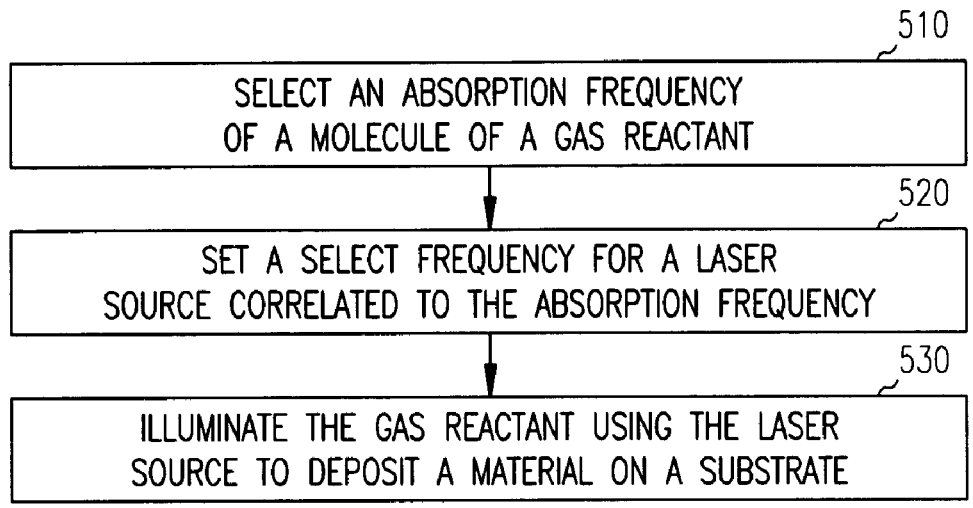
FIG. 5 illustrates a flow diagram of elements for an embodiment of a method to form a material on a substrate by point of use activation in laser assisted deposition of the material, according to the teachings of the present invention.

FIG. 5 illustrates a flow diagram of elements for an embodiment of a method to form a material on a substrate by point of use activation in laser assisted deposition of the material. In this embodiment, the method includes selecting an absorption frequency of a molecule of a gas reactant, at block 510, setting a select frequency for a laser source correlated to the absorption frequency, at block 520, and illuminating the gas reactant using the laser source, at block 530.

In an embodiment, frequencies for a laser source are selected to correspond to absorption frequencies for destabilizing bonds in gas reactants used to form a material on a substrate. The laser source is provided by using an array of lasers, where the each laser is chosen such that its frequency corresponds to an absorption frequency of one of the gas reactants used in the deposition process. In an embodiment, for each precursor that is to be activated, there corresponds at least one laser in a laser array having a laser frequency correlated to an absorption frequency of the given reactant. In an embodiment, a method includes using an array of laser diodes. Alternately, the energy imparted to the gas reactants can be applied using tunable lasers, other solid state lasers, or gas lasers. In an alternate embodiment, a source providing electromagnetic energy at a select target frequency, or frequencies, with a narrow linewidths can used as a source to irradiate the gas reactant, or reactants.

In an embodiment, the laser source is provided in a configuration adapted to be attached and detachable from a reaction chamber. For each deposition process involving a different set of gas reactants to deposit different materials onto a substrate at different stages of processing or in fabricating different systems or devices, a different laser source is mounted to the reaction chamber. Each newly attached laser source has an array of lasers with frequencies correlated to the absorption frequencies to the new set of gas reactants.

Figure 6:
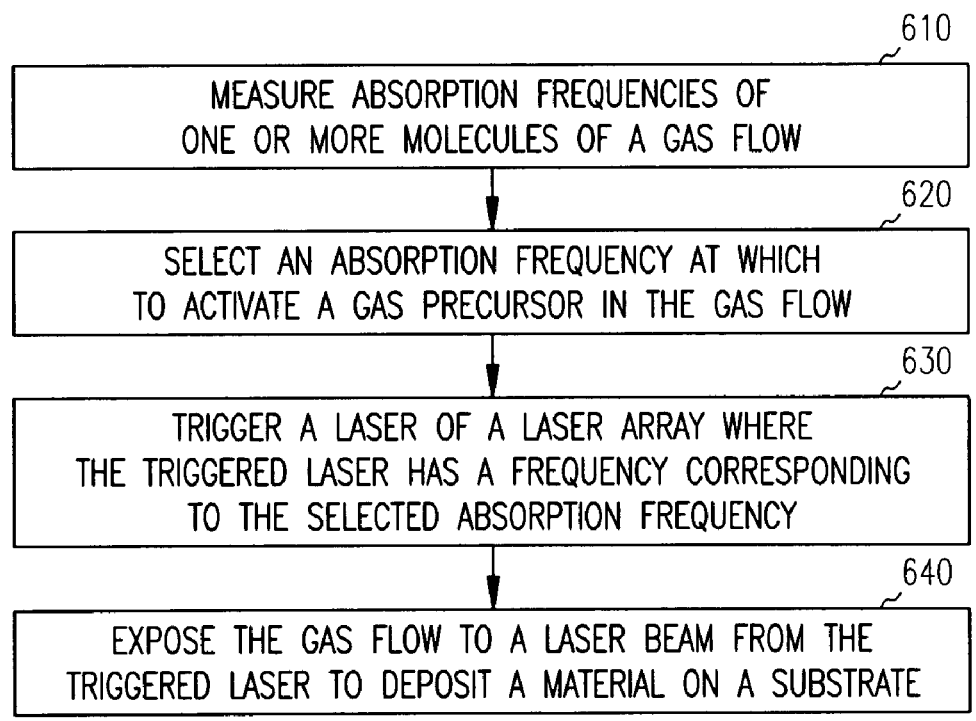
FIG. 6 illustrates a flow diagram of elements for an embodiment of a method to form a material on a substrate by point of use activation in laser assisted deposition of the material, according to the teachings of the present invention.

FIG. 6 illustrates a flow diagram of elements for an embodiment of a method to form a material on a substrate by point of use activation in laser assisted deposition of the material. In this embodiment, the method includes measuring absorption frequencies of one or more molecules of a gas flow, at block 610, selecting an absorption frequency at which to activate a gas precursor in the gas flow, at block 620, triggering a laser of a laser array where the triggered laser has a frequency corresponding to the selected absorption frequency, at block 630, and exposing the gas flow with a laser beam from the triggered laser to deposit a material on the substrate, at block 640.

In those embodiments in which the absorption frequencies of the molecules used in a gas flow are known, measuring the absorption frequencies of one or more molecules of a gas flow includes looking up the absorption frequencies in a table for the molecules used in the gas flow. Such a table can be realized in a database when performed in a computerized manner. Specific energies are imparted such that absorption of these energies is by specifically targeted molecules in the gas flow in specific amounts to activate the targeted molecules. In an alternate embodiment, the gas flow is exposed to electromagnetic energy from a source having filters and attenuators to provide the electromagnetic energy at a select frequency and intensity to impart specifically targeted amounts of energy.

An electronic device can be fabricated having a circuit disposed on a substrate, where forming the circuit includes depositing a material on the substrate by irradiating a gas precursor with electromagnetic energy. The substrate may include, but is not limited to, substrate materials such as silicon, silicon-on insulator (SOI), silicon-on sapphire (SOS), silica, ceramic, alumina, metals, organic materials, silicon-germanium, germanium, or gallium arsenide. The electromagnetic energy at a frequency tuned to an absorption frequency of the gas precursor activates the targeted gas precursor to provide the necessary energy to react with other gases in a reaction chamber or react with a surface of the substrate to form the desired material. Applying electromagnetic energy to different precursor gases according to various embodiments in various process stages allows for efficient construction of the structures for the electronic device. Various electronic devices can be fabricated using electromagnetic energy assisted deposition in accordance with embodiments of the teachings of the present invention, such as transistors, integrated circuits, memory devices, processors, and electronic systems having a variety of electronic components.

Figure 7:
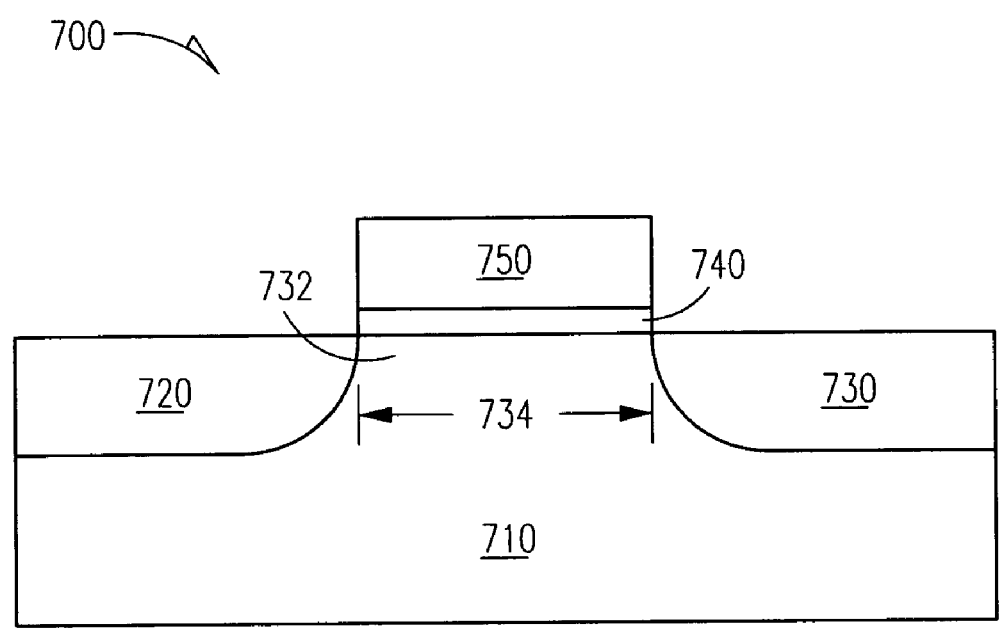
FIG. 7 shows an embodiment of a transistor constructed using point of use activation in laser assisted deposition of one or more materials on a substrate, according to the teachings of the present invention.

FIG. 7 shows an embodiment of a transistor 700 constructed using point of use activation in laser assisted deposition of one or more materials on a substrate. Transistor 700 is constructed by forming a source region 720 and a drain region 730 in a silicon based substrate 710 where source and drain regions 720, 730 are separated by a body region 732. Body region 732 defines a channel having a channel length 734. A dielectric layer is disposed on substrate 710 to form gate dielectric 740.

A gate 750 is formed over gate dielectric 740. Typically, forming gate 750 may include forming a polysilicon layer, though a metal gate may be formed in an alternative process. The sequencing of the various elements of the process for forming a transistor, including embodiments for point of use activation, is conducted in-line with standard fabrication procedures, as known to those skilled in the art. Other types of transistors including bipolar transistors may be fabricated using various embodiments using point of use activation in laser assisted deposition of one or more materials on a substrate.

Transistors, capacitors, and other devices using methods described herein may be implemented into memory devices and electronic systems including information handling devices. Such information devices may include wireless systems, telecommunication systems, and computers. It will be recognized by one skilled in the art that several types of memory devices and electronic systems including information handling devices utilize embodiments of the present invention.

Figure 8:
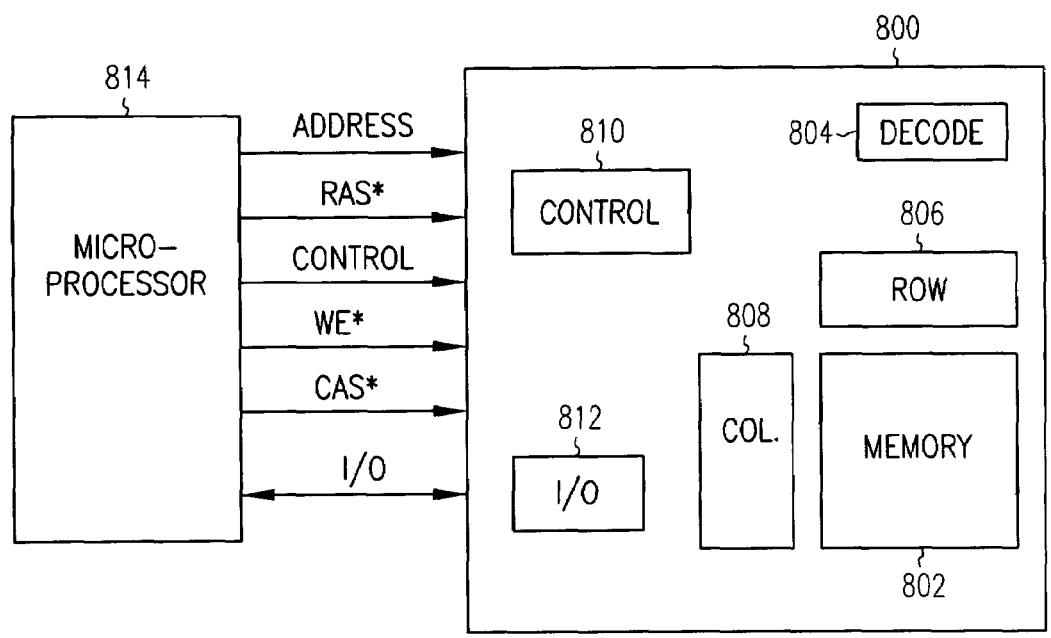
FIG. 8 is a simplified block diagram for an embodiment of a memory device having one or more materials formed on a substrate using point of use activation in laser assisted deposition of the materials, according to the teachings of the present invention.

FIG. 8 is a simplified block diagram for an embodiment of a memory device 800 having one or more materials formed on a substrate using point of use activation in laser assisted deposition of the materials. Memory device 800 includes an array of memory cells 802, address decoder 804, row access circuitry 806, column access circuitry 808, control circuitry 810, and input/output (I/O) circuit 812. The memory is operably coupled to an external microprocessor 814, or memory controller for memory accessing. Memory device 800 receives control signals from processor 814, such as WE*, RAS* and CAS* signals, which can be supplied on a system bus. Memory device 800 stores data that is accessed via I/O lines. Each memory cell in a row of memory cell array 802 is coupled to a common word line. The word line is coupled to gates of individual transistors. At least one material is deposited in the memory device structure using point of use activation in laser assisted deposition of the material, in accordance with the methods and apparatus previously described herein. Additionally, each memory cell in a column is coupled to a common bit line. Each cell in memory array 802 may include a storage capacitor and an access transistor as is conventional in the art. It will be appreciated by those skilled in the art that additional circuitry and control signals can be provided, and that the memory device of FIG. 8 has been simplified to focus on embodiments of the present invention.

It will be understood that the above description of a memory device is intended to provide a general understanding of the memory and is not a complete description of all the elements and features of a specific type of memory, such as DRAM (Dynamic Random Access Memory). Further, embodiments are equally applicable to any size and type of memory circuit and are not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Figure 9:
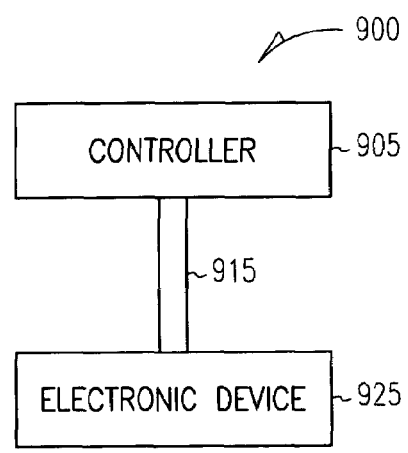
FIG. 9 illustrates a block diagram for an embodiment of an electronic system having devices with one or more materials formed on a substrate using point of use activation in laser assisted deposition of the materials, according to the teachings of the present invention.

FIG. 9 illustrates a block diagram for an embodiment of an electronic system 900 having devices with one or more materials formed on a substrate using point of use activation in laser assisted deposition of the materials. Electronic system 900 includes a controller 905, a bus 915, and an electronic device 925, where bus 915 provides electrical conductivity between controller 905 and electronic device 925. In various embodiments, controller 905 and/or electronic device 925 include an embodiment for one or more materials formed on a substrate using point of use activation in laser assisted deposition of the materials, as discussed herein. In an embodiment, electronic system 900 includes a plurality of electronic devices having one or more materials formed on a substrate using point of use activation in laser assisted deposition of the materials, according to the present invention. Electronic system 900 may include, but is not limited to, information handling devices, wireless systems, telecommunication systems, fiber optic systems, electro-optic systems, and computers.

Point of use activation in laser assisted deposition of materials provides for specific control of energies imparted to reacting chemical species providing enhanced control of the temperature of the chemical species. In the various embodiments, point of use activation provides heating essentially at localized levels without the general heating of the gas precursor and other gases, including carrier gases, in a gas flow. This specific control provides for a reaction efficiency that may allow for reduction in the consumption of source materials. This process may also provide for faster control of reaction temperatures and may provide for a significant reduction or elimination of by-products associated with the chemical reactant that leads to the deposition of a desired material on a substrate. Point of use activation also allows for the use of chemistries that are sensitive to conventional heating processes.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the present invention includes any other applications in which the above structures and fabrication methods are used. The scope of the present invention should be determined with reference to the appended claims, along with the full scope of equivalents to which such claims are entitled.

What is claim is:

1. A method for forming a film on a substrate comprising:
    activating a gas to generate a precursor by irradiating the gas with electromagnetic energy at a frequency tuned to a bond energy of the gas, the electromagnetic energy sourced from a diode laser of a diode laser array, the diode laser array having at least one diode laser with a center frequency different from that of another diode laser of the laser array; and
    forming a material on the substrate using the generated precursor.

2. The method of claim 1, wherein the method includes limiting the activation of the gas to within a mean free path of the gas precursor from the substrate.

3. The method of claim 1, wherein the method includes limiting the activation of the gas to above the substrate and within ten mean free paths of the gas from the substrate.

4. The method of claim 1, wherein the method includes activating a second gas with electromagnetic energy having a second center frequency tuned to a bond energy of the second gas, the electromagnetic energy having the second center frequency sourced from a second diode laser of the diode laser array.

5. The method of claim 4, wherein activating the gas and activating the second gas are performed in a common stage of processing.

6. The method of claim 4, wherein activating the gas and activating the second gas are performed in different stages of processing.

7. The method of claim 1, wherein the method includes controlling an amount of energy to activate the gas.

8. The method of claim 1, wherein the method includes physically measuring the absorption frequency of the gas precursor before activating the gas.

9. The method of claim 1, wherein the method includes forming the material in an integrated circuit on the substrate.

10. The method of claim 1, wherein the method includes forming the material in a transistor on the substrate.

11. The method of claim 1, wherein the method includes forming the material in a memory on the substrate.

12. The method of claim 1, wherein the method includes forming the material in an integrated circuit on the substrate and coupling the integrated circuit to a controller.

13. The method of claim 1, wherein coupling the integrated circuit to a controller includes coupling the integrated circuit to a processor.

* * * * *